United States Patent [19]

Danko

[11] 4,362,564

[45] Dec. 7, 1982

[54] METHOD FOR PRODUCING MICROPOROUS METAL BODIES

[75] Inventor: Joseph C. Danko, Danville, Calif.

[73] Assignee: The United States of America as represented by the United States Department of Energy, Washington, D.C.

[21] Appl. No.: 668,744

[22] Filed: Sep. 12, 1967

[51] Int. Cl.$^3$ ............................................... B22F 3/00
[52] U.S. Cl. ........................................ 75/222; 75/224; 75/84.4; 148/130
[58] Field of Search ................ 75/176, 222, 224, 84.4; 117/107.2; 148/130

[56] References Cited

U.S. PATENT DOCUMENTS

| | | | |
|---|---|---|---|
| 3,139,658 | 7/1964 | Brenner | 117/107.2 X |
| 3,234,007 | 2/1966 | Blocher | 75/84.4 X |
| 3,318,724 | 5/1967 | Heestand | 117/107.2 X |
| 3,343,979 | 9/1967 | Hamrin | 117/107.2 X |

Primary Examiner—Brooks H. Hunt

[57] ABSTRACT

Tungsten is vapor-deposited by hydrogen reduction of tungsten hexafluoride ($WF_6$) to produce a tungsten body having from 40 to 100 ppm fluorine. The tungsten is then heated under vacuum to produce grain boundary porosity for a sufficient period of time to allow the pores along the grain boundaries to become interconnected.

1 Claim, No Drawings

METHOD FOR PRODUCING MICROPOROUS METAL BODIES

The invention described herein was made in the course of, or under, Contract No. AT(04-3)-189, Project Agreement 32, with the U.S. Atomic Energy Commission.

BACKGROUND OF THE INVENTION

This invention relates primarily to pore forming in metal bodies, and in particular to methods of producing microporous bodies of tungsten.

In the development of thermionic reactors where the emitter contains a fissile fuel material, the generation of fission product gases becomes a problem. The emitter body, which is spaced apart from the collector by a very narrow gap, tends to enlarge and change dimensionally in reaction to the increase in the internal gas pressure due to the generation of fission product gases. The enlargement of the emitter, if left unchecked, will, in a time shorter than the life of the fissile fuel, cause the emitter to come in contact with the collector, thus shorting out the converter cell and reducing the power generating capacity of the thermionic reactor.

Venting of the emitter must be achieved without releasing any particles of fissile fuel which would detrimentally contaminate the emitter surface, collector surface, or cesium vapor, or detrimentally increase the space charge effect.

The present invention concerns a process for forming porous openings in tungsten used as cladding for the emitter in thermionic converter containing fissile fuel, which acts somewhat in the manner of a filter to permit the flow of fission product gases, but prevents the release of fissile fuel particles outside the emitter cladding. To be effective, such pore openings and passageways must be microscopic in size, e.g., the pore openings must be large enough to permit the molecules and atoms of the fission product gases to pass through, but small enough to retain the fissile fuel molecules and particles.

SUMMARY OF THE INVENTION

Basically, the process of this invention comprises vaporizing tungsten hexafluoride in a reducing atmosphere of hydrogen to deposit metallic tungsten having a fluorine content of from 40 to 100 ppm and subsequently heating said deposited tungsten in a vacuum for a sufficient period of time to produce pores along the grain boundaries and interconnection of said pores.

The resulting process is a body of tungsten having microscopic channels therethrough along the grain boundaries of the metal.

It is therefore an object of this invention to provide a process for making a microporous metal body.

It is a further object of this invention to provide a process for making a metal body having continuous microscopic channels along the grain boundaries thereof.

It is another object of this invention to provide a process for making a microporous metal cladding for a fissile fuel.

It is yet another object of this invention to provide a process for making a microporous vent in a high melting temperature metal.

Other and more particular objects of this invention will be manifest upon study of the following detailed description.

DESCRIPTION OF THE PREFERRED EMBODIMENT

The basic steps of the process of this invention comprise first depositing tungsten onto a surface by vaporizing tungsten hexafluoride ($WF_6$) in a reducing atmosphere of hydrogen, to leave from 40 to 100 ppm fluorine in the deposited tungsten; and second, heating the deposited tungsten to a temperature below its melting point, but high enough to promote the growth of grain boundary porosity so that it becomes interconnected within a reasonable period of time.

The process for depositing tungsten onto a surface by vaporizing tungsten hexafluoride ($WF_6$) in a reducing atmosphere of hydrogen is well known in the prior art, as evidenced by the textbook "Vapor Deposition" by Carroll F. Powell et al., published by John Wiley & Sons, Inc., New York, N.Y., 1966 (see pages 322-326 and pages 302-305); the "Proceedings of the Conference on Chemical Vapor Deposition of Refractory Metals, Alloys and Compounds" published by the American Nuclear Society, Incorporated, 1967 (see pages 110-125, 275-289, 303-314, 329-425); the "Thermionic Conversion Specialist Conference" published by IEEE, 1966 (see pages 204-211); and U.S. Pat. Nos. 3,139,658 and 3,318,724 issued to A. Brenner et al. and R. L. Heestand et al., respectively.

The surface upon which the tungsten is deposited is removed before the heating step, either by reaction with an acid or caustic, or other means common in the art.

EXAMPLE 1

The tungsten which was deposited in the shape of a cylinder about 0.95 inches long and 0.46 inches in diameter, to a thickness of 0.040 inch by hydrogen reduction of tungsten hexafluoride ($WF_6$) with a residual fluorine count of from 70 to 100 ppm was placed in a vacuum environment of about $10^{-6}$ torr. It was then heated to a temperature of 2500° C. for a period of 25 hours.

The porosity of the sample was measured by helium mass spectrometer leak detector (sensitivity of $10^{-10}$ cc helium/sec) and metallographic analysis revealed interconnected grain boundary porosity. The leak rate was found to be $10^{-6}$–$10^{-5}$ cc/sec.

EXAMPLE 2

Another tungsten sample having a thickness of 0.040 inch which was deposited by hydrogen reduction of tungsten hexafluoride ($WF_6$) with a residual fluorine content of from 40 to 70 ppm, and was also placed in a vacuum environment of about $10^{-6}$ torr. It was then heated to a temperature of about 2500° C., but for a period of 50 hours.

The porosity of the sample was measured by helium mass spectrometer leak detector (sensitivity of $10^{-10}$ cc helium/sec) and metallographic analysis revealed interconnected grain boundary porosity. The leak rate was found to be $10^{-6}$–$10^{-5}$ cc/sec.

In general, the thickness of the sample will not affect the length of time the sample must be maintained at 2500° C.; however, for most uses, the tungsten will be from 0.020 to 0.040 inch in thickness, and under these conditions, the length of time the sample is normally held at 2500° is from 25 to 50 hours.

In addition, the lower the temperature is maintained below 2500° C., the longer the sample must remain at the lower temperature to achieve comparable porosity.

Although the foregoing embodiment has been described in detail, there are obviously many other embodiments and variations in configuration which can be made by a person skilled in the art without departing from the spirit, scope or principle of this invention. Therefore, this invention is not to be limited except in accordance with the scope of the appended claims.

I claim:

1. A process for producing a microporous tungsten body adapted for use as cladding for the emitter in a thermionic converter containing fissile fuel, and which functions to permit the flow of fission product gases, but prevents the release of fissile fuel particles outside the emitter cladding, comprising the steps of: vapor-depositing, to a thickness of about 0.020 to 0.040 inch, on a suitable support surface, impure tungsten having a fluorine content of from about 40 to 100 ppm by hydrogen reduction of tungsten hexafluoride ($WF_6$); removing the support surface from the deposited tungsten; and heating said impure vapor-deposited tungsten in a vacuum environment of about $10^{-6}$ torr at a temperature of about 2500° C. for about 25 to 50 hours, so that grain boundary porosity occurs and becomes interconnected.

* * * * *